(12) United States Patent
Lee et al.

(10) Patent No.: US 10,498,142 B2
(45) Date of Patent: Dec. 3, 2019

(54) DEVICE AND METHOD FOR EXTINCTION ANGLE CONTROL OF HVDC SYSTEM

(71) Applicant: KOREA ELECTRIC POWER CORPORATION, Naju-si (KR)

(72) Inventors: Seong-Doo Lee, Daejeon (KR); Soon-Ho Choi, Daejeon (KR); Chur-Hee Lee, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 0 days.

(21) Appl. No.: 16/342,511

(22) PCT Filed: Nov. 24, 2016

(86) PCT No.: PCT/KR2016/013586
§ 371 (c)(1),
(2) Date: Apr. 16, 2019

(87) PCT Pub. No.: WO2018/079917
PCT Pub. Date: May 3, 2018

(65) Prior Publication Data
US 2019/0245351 A1    Aug. 8, 2019

(30) Foreign Application Priority Data

Oct. 28, 2016 (KR) .......................... 10-2016-0141741

(51) Int. Cl.
*H02J 3/36* (2006.01)
*H02M 5/45* (2006.01)
*G01R 21/00* (2006.01)

(52) U.S. Cl.
CPC .............. *H02J 3/36* (2013.01); *G01R 21/003* (2013.01); *H02M 5/45* (2013.01)

(58) Field of Classification Search
CPC .... H02J 3/36; H02J 2003/365; G01R 21/003; G01R 21/00; G01R 11/52; G01R 21/133; H02M 5/45; H02M 5/44; Y02E 60/60
See application file for complete search history.

(56) References Cited

U.S. PATENT DOCUMENTS 4,638,416 A * 1/1987 Neupauer ................ H02J 3/36
363/35
5,535,113 A 7/1996 Konishi
(Continued)

FOREIGN PATENT DOCUMENTS

JP 1993-211779 A 8/1993
JP 2000-14009 A 1/2000
(Continued)

*Primary Examiner* — Adolf D Berhane
(74) *Attorney, Agent, or Firm* — Foundation Law Group, LLP

(57) ABSTRACT

A device for extinction angle control of a high voltage direct current (HVDC) system, includes: a converter reactive power calculator calculating a reactive power variation amount of a converter included in the HVDC system, depending on firing angle control of the converter; an alternating current (AC) system short circuit level calculator calculating a short circuit level of an AC system by applying the reactive power variation amount to a short circuit level formula of the AC system connected to the HVDC system; an extinction angle variation value calculator calculating an extinction angle variation value of the converter, corresponding to the short circuit level; and an extinction angle controller controlling an extinction angle of the converter, depending on an extinction angle control value reflecting the extinction angle variation value.

6 Claims, 8 Drawing Sheets

(56) References Cited

U.S. PATENT DOCUMENTS

| | | | | |
|---|---|---|---|---|
| 5,701,239 | A * | 12/1997 | Bjorklund | H02J 3/36 363/35 |
| 10,291,023 | B2 * | 5/2019 | Chae | H02J 3/01 |
| 10,396,559 | B2 * | 8/2019 | Shin | H02J 3/16 |
| 2006/0282239 | A1 | 12/2006 | Chu et al. | |
| 2014/0146582 | A1 * | 5/2014 | Gupta | H02M 7/7575 363/35 |
| 2014/0198538 | A1 * | 7/2014 | Kimura | H02M 3/33507 363/21.09 |
| 2016/0049880 | A1 | 2/2016 | Kim et al. | |
| 2018/0358907 | A1 * | 12/2018 | Kato | H02M 1/126 |

FOREIGN PATENT DOCUMENTS

| | | |
|---|---|---|
| JP | 2013-112055 A | 6/2013 |
| KR | 10-0791625 B1 | 1/2008 |
| KR | 10-2012-0106461 A | 9/2012 |
| KR | 10-1425400 B1 | 8/2014 |
| KR | 10-2015-0094029 A | 8/2015 |
| KR | 10-2016-0032348 A | 3/2016 |

* cited by examiner

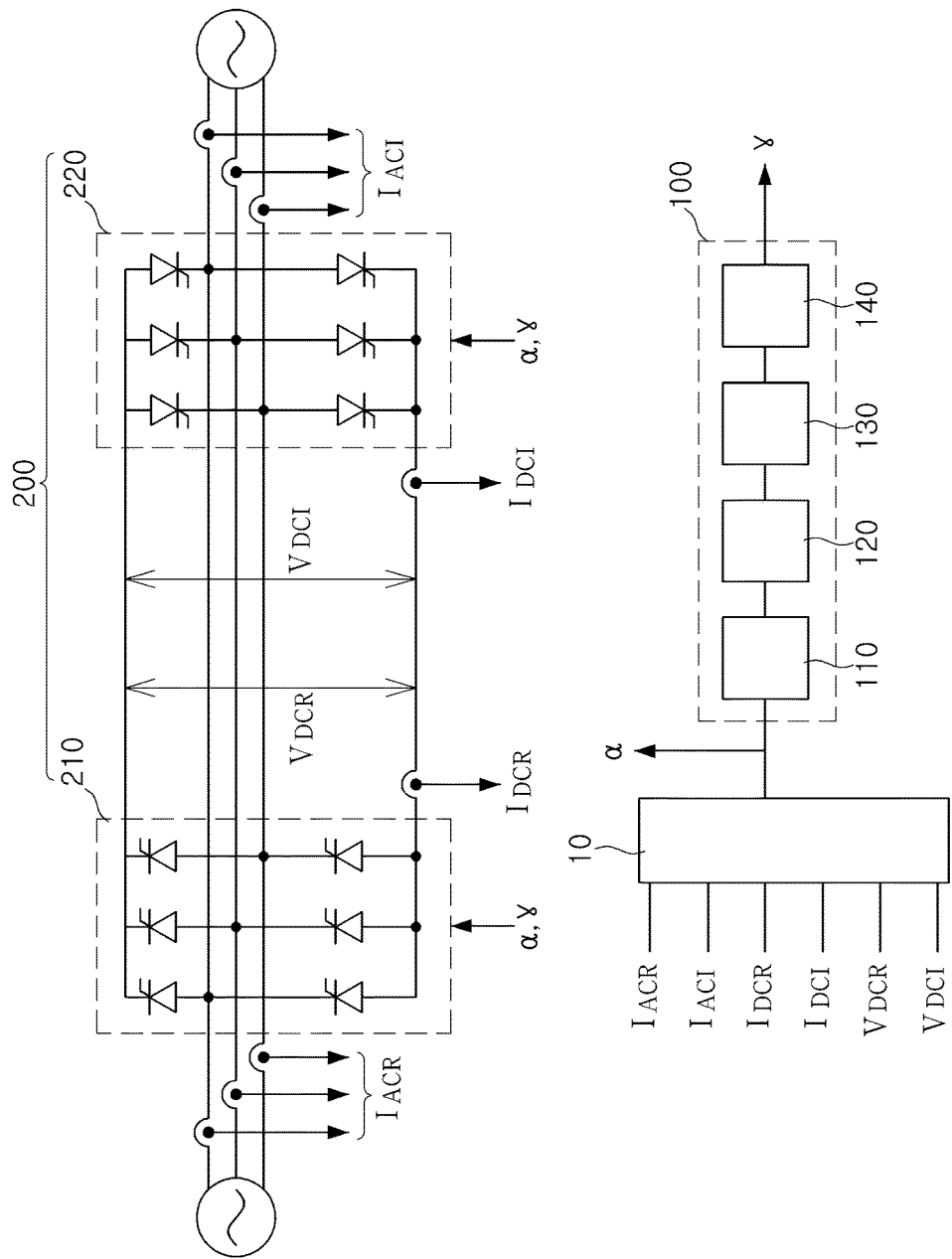
[FIG. 1]

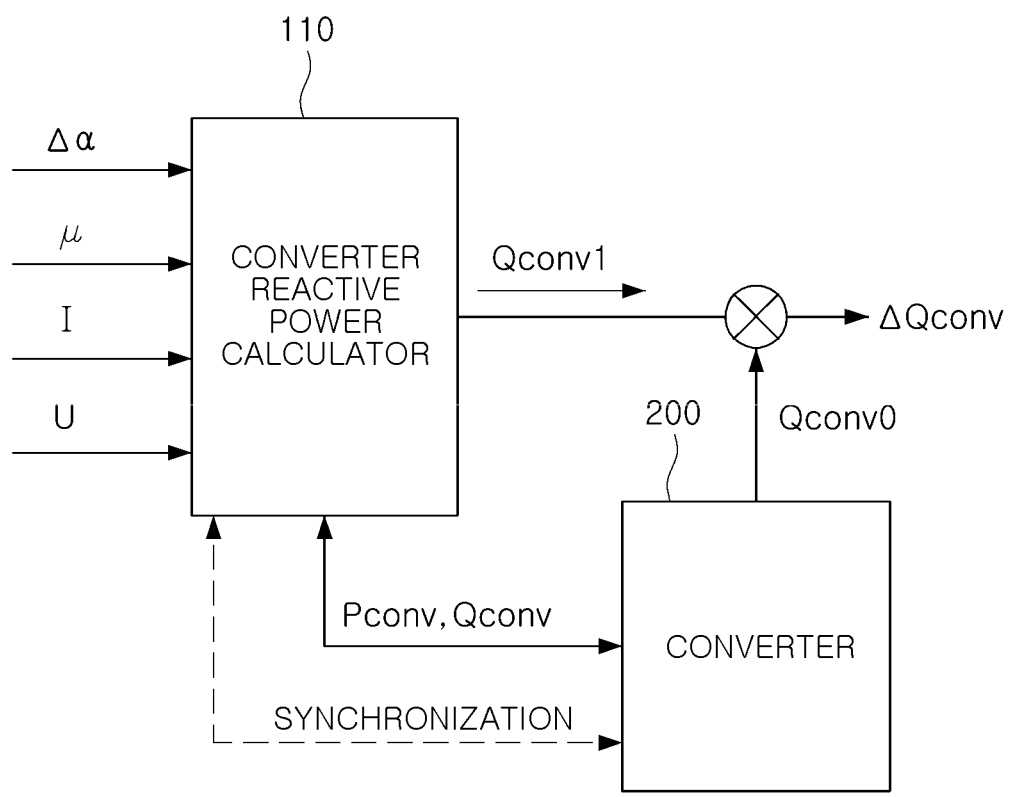
[FIG. 2]

[FIG. 3]
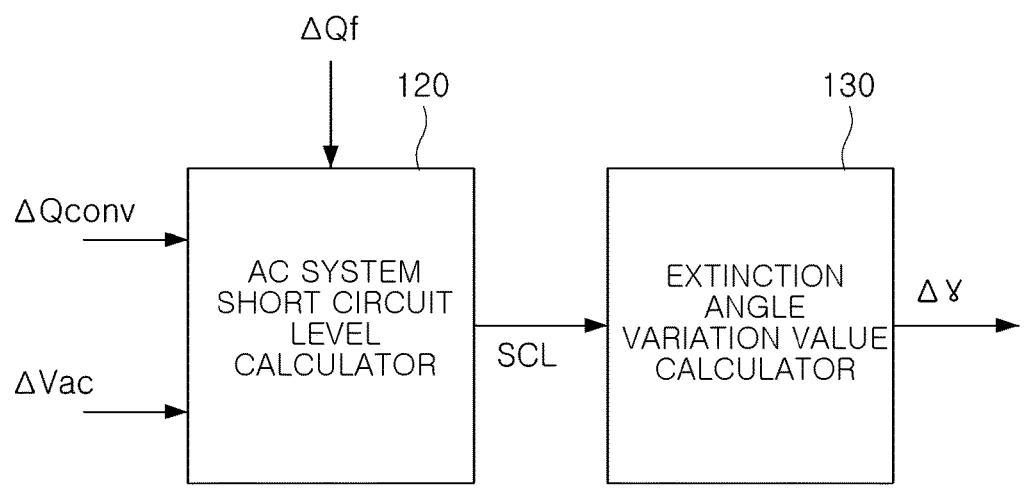

[FIG. 4]
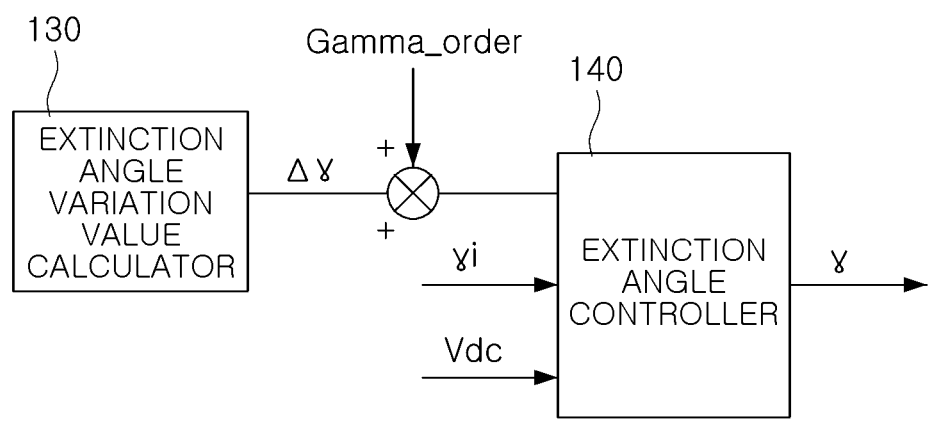

[FIG. 5]
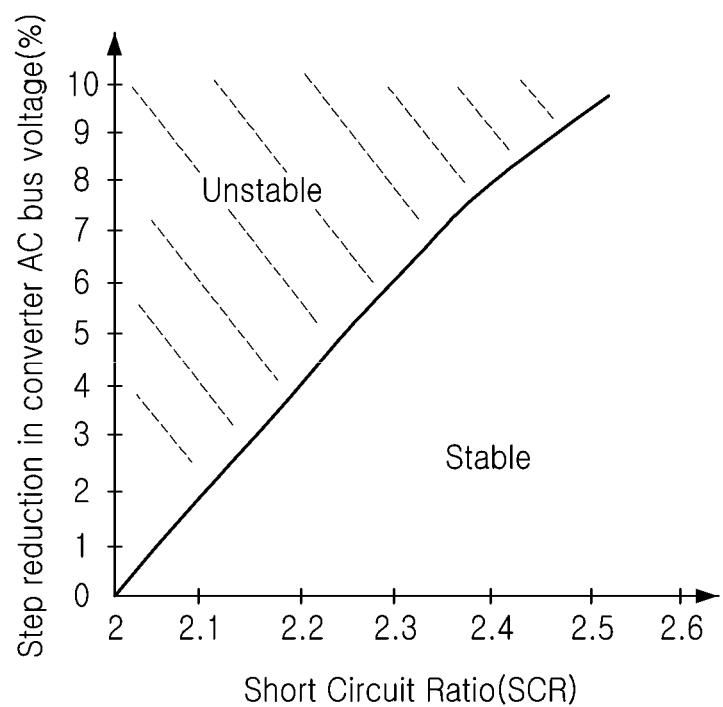

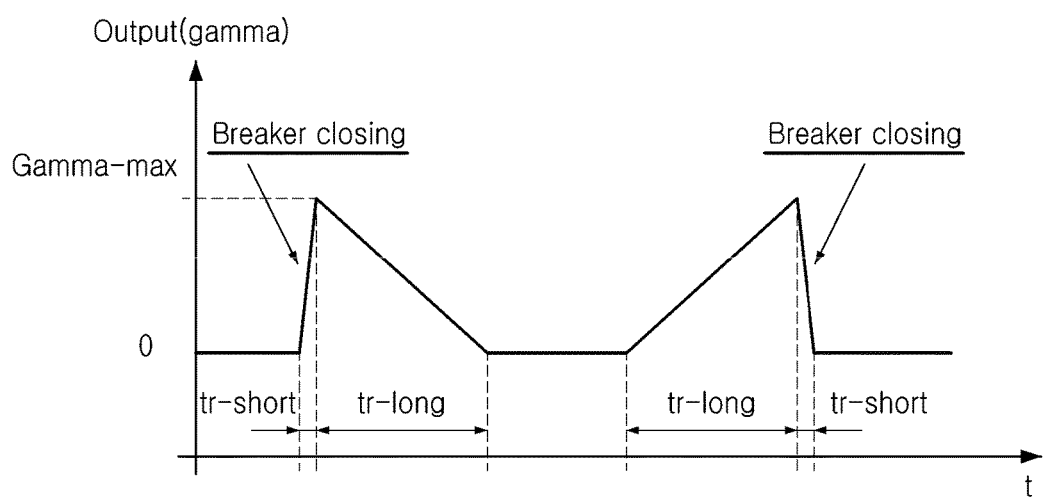
[FIG. 6]

[FIG. 7]
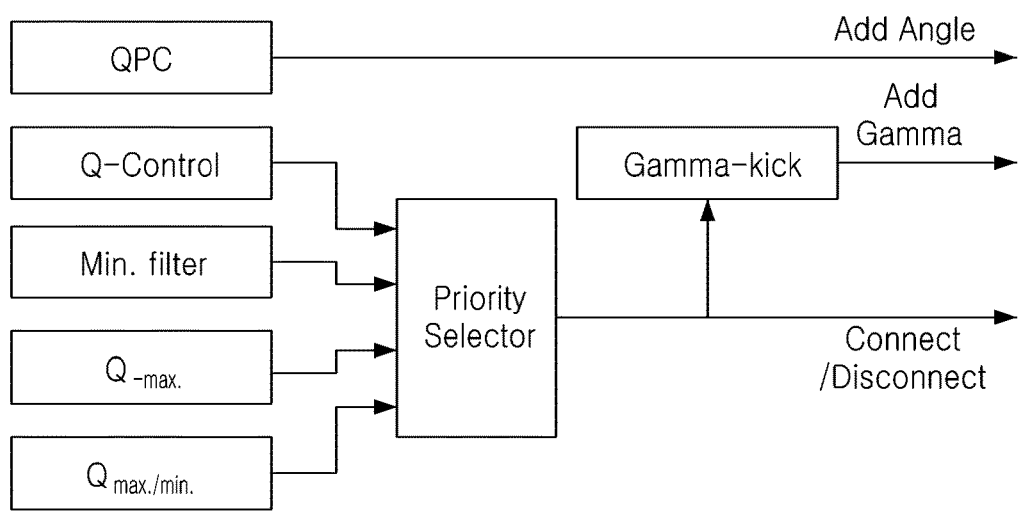

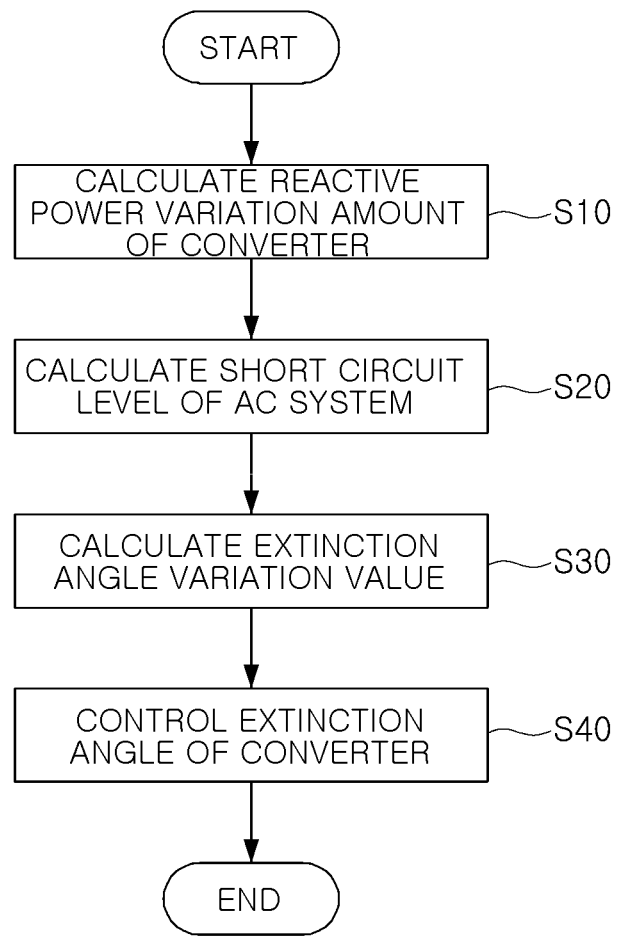

DEVICE AND METHOD FOR EXTINCTION ANGLE CONTROL OF HVDC SYSTEM

CROSS REFERENCE TO RELATED PATENT APPLICATION

This application claims the benefit under 35 U.S.C. Section 371, of PCT International Application No. PCT/KR2016/013586, filed on Nov. 24, 2016, which claimed priority to Korean Patent Application No. KR 10-2016-0141741, filed on Oct. 28, 2016, the disclosures of which are hereby incorporated by the references.

TECHNICAL FIELD

The present disclosure relates to a device and method for controlling an extinction angle of a high voltage direct current (HVDC) system.

BACKGROUND ART

An HVDC system is a system that converts alternating current (AC) power, generated by a power plant, into direct current (DC) power, transmits the DC power, converts the DC power back into AC power at a receiving end, and supplies the AC power to a load. Such a HVDC system may allow power to be efficiently and economically transmitted by a voltage increase, which is an advantage of AC power transmissions, and may overcome various shortcomings of AC power transmissions (such as efficiency of long distance transmission, and the like).

For controlling an effective power transmission amount of the HVDC system, a firing angle of the converter (rectifier or inverter) included in the HVDC system may be controlled. However, such control may cause reactive power variations and vibrations of the converter, and such reactive power variations and vibrations may cause problems such as a rectification failure of a converter.

DISCLOSURE

Technical Problem

An aspect of the present disclosure may provide a device and method for controlling an extinction angle of an HVDC system that may improve stability of the system by controlling an extinction angle of a converter included in the HVDC system.

Technical Solution

According to an aspect of the present disclosure, a device for extinction angle control of a high voltage direct current (HVDC) system includes: a converter reactive power calculator calculating a reactive power variation amount of a converter included in the HVDC system, depending on firing angle control of the converter; an alternating current (AC) system short circuit level calculator calculating a short circuit level of an AC system by applying the reactive power variation amount to a short circuit level formula of the AC system connected to the HVDC system; an extinction angle variation value calculator calculating an extinction angle variation value of the converter, corresponding to the short circuit level; and an extinction angle controller controlling an extinction angle of the converter, depending on an extinction angle control value reflecting the extinction angle variation value.

For example, the device may further include a firing angle controller controlling a firing angle of the converter depending on a firing angle control value and transmitting the firing angle control value to the converter reactive power calculator.

According to an aspect of the present disclosure, a method for extinction angle control of a high voltage direct current (HVDC) system, includes: calculating a reactive power variation amount of a converter included in the HVDC system, depending on firing angle control of the converter; calculating a short circuit level of an alternating current (AC) system by applying the reactive power variation amount to a short circuit level formula of the AC system connected to the HVDC system; calculating an extinction angle variation value of the converter, corresponding to the short circuit level; and controlling an extinction angle of the converter, depending on a final extinction angle control value reflecting the extinction angle variation value to an extinction angle control value of the HVDC system.

Advantageous Effects

According to an aspect of the present disclosure, the stability of the system may be efficiently improved by appropriately controlling the extinction angle of the converter included in the HVDC system.

The device for extinction angle control of the HVDC system according to an embodiment of the present disclosure may calculate the optimum extinction angle capable of improving the stability of the HVDC system while reducing deterioration of the transmission power quality.

DESCRIPTION OF DRAWINGS

FIG. 1 is a view illustrating a device for extinction angle control of an HVDC system according to an embodiment of the present disclosure;

FIG. 2 is a diagram illustrating calculation of a converter reactive power calculator;

FIG. 3 is a diagram illustrating calculation of an AC system short circuit level calculator;

FIG. 4 is a diagram illustrating calculation of an extinction angle controller;

FIG. 5 is a graph illustrating an AC system voltage variation according to a short circuit ratio;

FIG. 6 is a graph illustrating an extinction angle over time;

FIG. 7 is a block diagram illustrating a control block diagram of an extinction angle controller; and FIG. 8 is a flowchart illustrating a method for extinction angle control of a HVDC system according to an embodiment of the present disclosure.

BEST MODE FOR INVENTION

The following detailed description of the present disclosure refers to the accompanying drawings, which illustrate, as a example, specific embodiments in which the present disclosure may be practiced. It can be understood that the various embodiments of the present disclosure are different, but need not be mutually exclusive. For example, certain features, structures, and characteristics described herein may be implemented in other embodiments without departing from the spirit and scope of the present disclosure in connection with an embodiment. It can also be understood that the position or arrangement of the individual components within each disclosed embodiment may be varied without departing from the spirit and scope of the present disclosure. The following detailed description is, therefore, not to be taken in a limiting sense, and the scope of the present disclosure is to be limited only by the appended claims, along with the full scope of equivalents to which the claims are entitled, if properly explained. In the drawings, like reference numerals refer to the same or similar functions in several views.

Hereinafter, embodiments of the present disclosure will be described in detail with reference to the accompanying drawings in order that those skilled in the art can easily carry out the present disclosure.

FIG. 1 is a view illustrating a device for extinction angle control of an HVDC system according to an embodiment of the present disclosure.

Referring to FIG. 1, a device 100 for controlling an extinction angle of a HVDC system according to an embodiment of the present disclosure may include a converter reactive power calculator 110, an AC system short circuit level calculator 120, an extinction angle variation value calculator 130, and an extinction angle controller 140, and may control an extinction angle (gamma) of a converter 200 including a rectifier 210 or an inverter 220.

A firing angle controller 10 may control a firing angle (alpha) of the converter 200 to control a DC voltage and an active power transmission amount of the HVDC system. For example, the firing angle controller 10 may collect DC voltage values (VDCR, VDCI), DC current values (IDCR, IDCI), and AC current values (IACR, IACI) of the HVDC system to determine a target DC voltage and a target active power transmission amount, and a firing angle control value may be set by referring to the collected values.

In addition, the firing angle controller 10 may finely control the firing angle of the converter 200 by finely changing the firing angle control value, to secure data for calculation of the device 100 for controlling the extinction angle of the HVDC system. The firing angle controller 10 may transmit the finely changed firing angle control value to the converter reactive power calculator 110.

The converter reactive power calculator 110 may calculate the reactive power variation amount of the converter 200, depending on firing angle control of the converter 200 included in the HVDC system. The fine control of the firing angle may cause consumption of the reactive power of the converter 200. The converter reactive power calculator 110 may know a correlation between the firing angle and the reactive power variation amount through the calculation of the reactive power variation amount.

The AC system short circuit level calculator 120 may calculate a short circuit level (SCL) of the AC system by applying the reactive power variation amount to a short circuit level formula of the AC system connected to the HVDC system. The short circuit level of the AC system may be a measure of how robust the AC system is against the reactive power variation. Therefore, the AC system short circuit level calculator 120 may know a correlation between the reactive power variation amount and the voltage step variation of the AC system through the short circuit level of the AC system.

The extinction angle variation value calculator 130 may calculate an extinction angle variation value of the converter 200 corresponding to the short circuit level. The HVDC system may be stabilized as the extinction angle is relatively wider, but a voltage drop of the AC system may be greater as the extinction angle is relatively wider. The voltage drop of the AC system may adversely affect the quality of the transmission power of the HVDC system. Therefore, the extinction angle variation value calculator 130 may calculate an extinction angle variation value to improve stability of the HVDC system while reducing quality of transmission power with reference with the short circuit level.

The extinction angle controller 140 may control an extinction angle of the converter 200, depending on the extinction angle control value reflecting the extinction angle variation value. Therefore, the HVDC system may improve stability of the HVDC system while reducing deterioration of the transmission power quality.

Meanwhile, each of the rectifier 210 and the inverter 220 may be implemented by a plurality of power semiconductors such as a thyristor and an IGBT, may receive a firing angle control signal from the firing angle controller 10 to switch an off-state of the plurality of power semiconductors to its on-state, and may receive an extinction angle control signal from the extinction angle controller 140 to switch an off-state of the plurality of power semiconductors to an on-state. Here, a reception time point of the firing angle control signal may be determined depending on the firing angle, and a reception time point of the extinction angle control signal may be determined depending on the extinction angle.

FIG. 2 is a diagram illustrating calculation of a converter reactive power calculator.

The converter reactive power calculator 110 may calculate a reactive power $Q_{conv1}$ after variation, and may calculate a reactive power variation amount $\Delta Q_{conv}$ obtained by subtracting a reactive power $Q_{conv0}$ before variation from the reactive power $Q_{conv1}$ after variation, by way of applying a firing angle (alpha), rectification reactance, no-load voltage, DC current, and active power of the converter 200 to a reactive power formula.

For example, the converter reactive power calculator 110 may set the following Equation 1 as the reactive power formula. Here, $P_{conv}$ the active power, $Q_{conv}$ is the reactive power, $X_{conv}$ is the rectification reactance, $I_d$ is the DC current, $E_{d0}$ is the no-load voltage, and $\alpha$ is the firing angle.

$$Q_{conv} = P_{conv} \frac{\mu \sin\mu \cos(2\alpha + \mu)}{\sin\mu \sin(2\alpha + \mu)} \ [MVAr] \qquad \text{[Equation 1]}$$

$$\mu = \cos^{-1}\left(\cos\alpha - \frac{\sqrt{2}\,X_{conv}I_d}{E_{d0}}\right) - \alpha \ [degree]$$

FIG. 3 is a diagram illustrating calculation of an AC system short circuit level calculator.

The AC system short circuit level calculator 120 may further apply a reactive power amount of a filter bank associated with the AC system and a voltage variation amount of the AC system to the short circuit level (SCL) formula.

For example, the AC system short circuit level calculator 120 may set the following Equation 2 as the short circuit level formula. Here, S is the short circuit level, U is the voltage of the AC system before firing angle control of the converter, $\Delta U_{ac}$ is the voltage variation amount of the AC system, $\Delta Q_{conv}$ is the reactive power variation amount of the converter, and $Q_f$ is the reactive power amount of the filter bank.

$$S = \frac{\Delta Q_{conv}}{\Delta U_{ac}} \cdot U + (Q_f - \Delta Q_{conv}) \qquad \text{[Equation 2]}$$

In addition, the AC system short circuit level calculator 120 may calculate the reactive power amount $Q_{filter}$ of the filter bank according to the following Equation 3. Here, f is a frequency value of the AC system, $f_0$ is a frequency value of the AC system at a reference voltage, Vac is a voltage value of the AC system, Vac0 is a voltage value of the AC system at the reference voltage and $f_0$, and $Q_{filter0}$ is a reactive power amount of the filter bank at the reference voltage and $f_0$.

$$Q_{filter} = Q_{filter_0} \cdot \frac{V_{ac}^2}{V_{ac_0}^2} \cdot \frac{f}{f_0} \quad [MVAr] \qquad \text{[Equation 3]}$$

FIG. 4 is a diagram illustrating calculation of an extinction angle controller.

The extinction angle controller 140 may calculate the extinction angle control value by adding or subtracting the extinction angle variation value, calculated by an extinction angle variation value calculator 130, to or from a predetermined set value (Gamma_order). The set value of the extinction angle may be determined depending on power loss, reactive power demand amount, rating of a transformer for conversion, and rating of a converter valve. Therefore, the extinction angle controller 140 may receive a voltage ($V_{ac}$) of the AC system, and may initially set a predetermined set value with reference to the voltage ($V_{ac}$) of the AC system.

Also, the extinction angle controller 140 may control the extinction angle of the converter depending on the extinction angle control value during an input or open period of a filter bank associated with the AC system. This is because a voltage step variation of the AC system may occur during the input or open period of the filter bank. For example, the extinction angle controller 140 may determine an extinction angle control time point of the converter using a control method called Gamma-kick.

The Gamma-kick control method may generate a severe voltage drop in the AC system when the extinction angle change value is excessive, and may adversely affect power quality.

Therefore, the device for extinction angle control of the HVDC system according to an embodiment of the present disclosure may calculate the optimum extinction angle capable of improving the stability of the HVDC system while reducing deterioration of the transmission power quality.

FIG. 5 is a graph illustrating an AC system voltage variation according to a short circuit ratio.

In particular, FIG. 5 illustrates stability limits of a converter AC bus voltage depending on various AC voltage step reduction values, when a converter having a certain extinction angle characteristic is operated.

Referring to FIG. 5, constant DC power and constant extinction angle control at a short circuit ratio of about 2.0 or less may cause a risk of voltage instability in an inverter AC bus-bar. For example, when a 10% voltage step variation occurs in the converter AC bus voltage, the short circuit ratio needs to be greater than or equal to about 2.5.

When an extinction angle is always constant, disturbances of an AC system, such as a step variation reduction of the converter AC bus voltage, may cause AC voltage drop and DC voltage drop.

At this time, a firing angle controller may increase DC current of an HVDC system to maintain DC power of the HVDC system.

The increase in DC current may increase reactive power absorption of the rectifier and inverter, and the increase in reactive power absorption may further reduce an AC system voltage at the inverter to further reduce DC voltage.

An AC system voltage on an inverter side in a relatively weak AC system may drop to a significant level until finding a stable operating point, and an AC system voltage on an inverter side in a relatively very weak AC system may not even find a stable operating point. This may cause the converter AC bus voltage to collapse.

Therefore, a device for extinction angle control of an HVDC system according to an embodiment of the present disclosure may appropriately control an extinction angle of the converter to efficiently improve stability of the system.

FIG. 6 is a graph illustrating an extinction angle over time.

Switching operations of reactive power compensation facility such as AC filters may cause AC voltage step variations in a converter AC bus-bar. Since the AC voltage step variations may cause voltage instability, a device for extinction angle control of an HVDC system according to an embodiment of the present disclosure may instantaneously increase the extinction angle at which the reactive power compensation facility is switched, to ameliorate step variations.

For example, a device for extinction angle control may temporarily increase an extinction angle reference at the time of switching a filter or a parallel capacitor to increase the converter reactive power consumption, thereby limiting the AC voltage step. Therefore, the extinction angle control device may restrict the voltage variation, and may prevent the rectification failure to some extent, such that voltage quality of an AC bus-bar may be maintained.

Referring to FIG. 6, a device for extinction angle control may raise the extinction angle from 0 to Gamma-max value before the filter is turned on, for tr-short time, and may decrease the extinction angle again for tr-long time.

The Gamma-max value, and the Tr-short and Tr-long times may be determined by an AC system review. Time constants, Tr-short and Tr-long times, may be set in conformity with time constants, voltage controller response times of the AC system. In addition, correct times may be determined by tests during factory testing and field commissioning periods.

FIG. 7 is a block diagram illustrating a control block diagram of an extinction angle controller.

Referring to FIG. 7, a device for extinction angle control of an HVDC system according to an embodiment of the present disclosure may be configured to change the extinction angle at an input or open time point of a filter, by disposing a Gamma-kick control block at a final stage of a steady state control loop of reactive power control.

FIG. 8 is a flowchart illustrating a method for extinction angle control of a HVDC system according to an embodiment of the present disclosure.

Referring to FIG. 8, a method for extinction angle control of a HVDC system according to an embodiment of the present disclosure may include an operation of calculating reactive power variation amount of a converter (S10), an operation of calculating a short circuit level of an AC system (S20), an operation of calculating an extinction angle variation value (S30), and an operation of controlling an extinction angle of a converter (S40).

An HVDC system in the operation of calculating reactive power variation amount of a converter (S10) may calculate a reactive power variation amount of a converter included in the HVDC system, depending on firing angle control of the converter.

An HVDC system in the operation of calculating a short circuit level of an AC system (S20) may calculate a short circuit level of an AC system by applying the reactive power variation amount to a short circuit level formula of the AC system connected to the HVDC system.

An HVDC system in the operation of calculating an extinction angle variation value (S30) may calculate an extinction angle variation value of the converter, corresponding to the short circuit level.

An HVDC system in the operation of controlling an extinction angle of a converter (S40) may control an extinction angle of the converter, depending on a final extinction angle control value reflecting the extinction angle variation value to an extinction angle control value of the HVDC system.

Meanwhile, the method for extinction angle control of the HVDC system may be implemented by a computing environment, including a processor, a memory, an additional storage, an input device, an output device, and a communications connection.

While the present disclosure has been described with reference to example embodiments, it can be understood that the present disclosure is not limited to the disclosed example embodiments. It will be apparent to those skilled in the art that various modifications could be made without departing from the scope of the present disclosure as defined by the appended claims.

The invention claimed is:

1. A device for extinction angle control of a high voltage direct current (HVDC) system, comprising:
   a converter reactive power calculator calculating a reactive power variation amount of a converter included in the HVDC system, depending on firing angle control of the converter;
   an alternating current (AC) system short circuit level calculator calculating a short circuit level of an AC system by applying the reactive power variation amount to a short circuit level formula of the AC system connected to the HVDC system;
   an extinction angle variation value calculator calculating an extinction angle variation value of the converter, corresponding to the short circuit level; and
   an extinction angle controller controlling an extinction angle of the converter, depending on an extinction angle control value reflecting the extinction angle variation value.

2. The device according to claim 1, further comprising a firing angle controller controlling a firing angle of the converter depending on a firing angle control value and transmitting the firing angle control value to the converter reactive power calculator.

3. The device according to claim 1, wherein the converter reactive power calculator applying a firing angle, a rectification reactance, a no-load voltage, a DC current, and an active power of the converter to a reactive power formula, to calculate the reactive power variation amount.

4. The device according to claim 1, wherein the AC system short circuit level calculator further applies a reactive power amount of a filter bank associated with the AC system and a voltage variation amount of the AC system to the short circuit level formula.

5. The device according to claim 1, wherein the extinction angle controller adds or subtracts the extinction angle variation value to or from a predetermined set value, to calculate the extinction angle control value, and controls an extinction angle of the converter depending on the extinction angle control value during an input or open period of a filter bank associated with the AC system.

6. A method for extinction angle control of a high voltage direct current (HVDC) system, comprising:
   calculating a reactive power variation amount of a converter included in the HVDC system, depending on firing angle control of the converter;
   calculating a short circuit level of an alternating current (AC) system by applying the reactive power variation amount to a short circuit level formula of the AC system connected to the HVDC system;
   calculating an extinction angle variation value of the converter, corresponding to the short circuit level; and
   controlling an extinction angle of the converter, depending on a final extinction angle control value reflecting the extinction angle variation value to an extinction angle control value of the HVDC system.

\* \* \* \* \*